United States Patent
Akahori (10) Patent No.: US 7,394,294 B2
(45) Date of Patent: Jul. 1, 2008

(54) COMPLEMENTARY PASS-TRANSISTOR LOGIC CIRCUIT AND SEMICONDUCTOR DEVICE

(75) Inventor: Akira Akahori, Tokyo (JP)

(73) Assignee: Okie Electric Industry Co., Ltd., Tokyo (JP)

( * ) Notice: Subject to any disclaimer, the term of this patent is extended or adjusted under 35 U.S.C. 154(b) by 71 days.

(21) Appl. No.: 11/283,852

(22) Filed: Nov. 22, 2005

(65) Prior Publication Data

US 2006/0109031 A1    May 25, 2006

(30) Foreign Application Priority Data

Nov. 25, 2004    (JP)    ............... 2004-340174

(51) Int. Cl.
    *H03K 19/20*    (2006.01)
(52) U.S. Cl. .................. 326/113; 326/112; 326/114; 326/119; 326/120
(58) Field of Classification Search .................. 326/113, 326/114, 112, 119, 120
    See application file for complete search history.

(56) References Cited

U.S. PATENT DOCUMENTS

| | | | | |
|---|---|---|---|---|
| 4,467,455 A | * | 8/1984 | Sood | ............... 365/189.05 |
| 4,939,390 A | * | 7/1990 | Coe | ............... 326/115 |
| 5,796,624 A | * | 8/1998 | Sridhar et al. | ............... 703/14 |
| 5,909,128 A | * | 6/1999 | Maeda | ............... 326/116 |
| 6,232,799 B1 | * | 5/2001 | Allen et al. | ............... 326/113 |

OTHER PUBLICATIONS

Kazuo Yano et al., "A 3.8ns CMOS 16×16—b Multiplier Using Complementary Pass-Transistor Logic", IEEE Journal of Solid-State Circuits, 25[2]Apr. 1990, pp. 388-395.

* cited by examiner

*Primary Examiner*—Rexford Barnie
*Assistant Examiner*—Thienvu V Tran
(74) *Attorney, Agent, or Firm*—Rabin & Berdo, P.C.

(57) ABSTRACT

A complementary pass-transistor logic includes input nodes provided with first complementary signals; intermediate nodes for outputting complementary intermediate signals; a logic network comprised of NMOS transistors, the network being connected between the input nodes and the intermediate nodes, and the conduction states of the transistors being controlled by second complementary input signals to output a logical operation result of the first and second input signals to the intermediate nodes; and inverters for inverting the intermediate signals and producing complementary output signals, wherein the NMOS transistors of the logic network are configured as a depletion-type NMOS.

3 Claims, 5 Drawing Sheets

COMPLEMENTARY PASS-TRANSISTOR LOGIC CIRCUIT AND SEMICONDUCTOR DEVICE

BACKGROUND OF THE INVENTION

1. Field of the Invention

The present invention relates to a high-speed complementary pass-transistor logic (referred to as "CPL", hereinafter).

2. Description of Related Art

Currently, CMOS logic is in vogue for semiconductor logic circuit. It is important to decrease the supply voltage of the CMOS logic for reducing power consumption, since power consumption is proportional to a square of power supply voltage in CMOS logic circuit.

A variety of circuit technologies have been proposed in which the operation speed is enhanced with a low supply voltage, since reducing the supply voltage causes a reduction of operation speed. Among them, there is a CPL in which a desired logic operation is provided using N-channel MOS transistors (referred to as "NMOSs", hereinafter) as signal transmission passes so as to configure a logic network.

Figure 2:
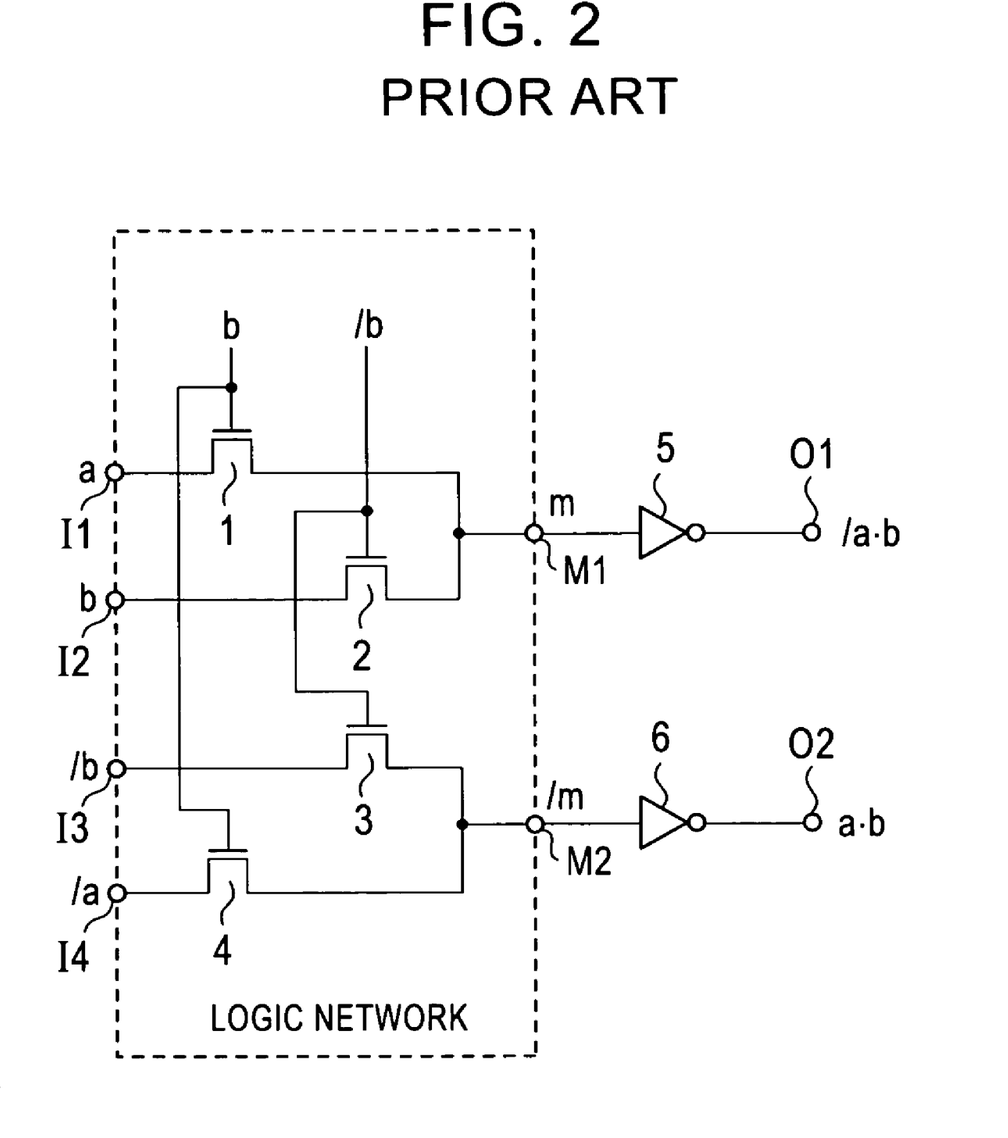
FIG. 2 shows a configuration of an AND comprised of a conventional CPL.

FIG. 2 is a configuration diagram illustrating a logical product gate comprised of a conventional CPL (referred to as "AND gate" or "AND", hereinafter), which is described in IEEE JOURNAL OF SOLID-STATE CIRCUITS, 25[2] (1990-4), pages. 388-395 entitled "A 3.8 ns CMOS 16×16-b Multiplier Using Complementary Pass-Transistor Logic".

The AND gate comprised of the CPL has input nodes I1 and I4 provided with complementary input signals "a" and "/a" (hereinafter, simply denoted as a and /a), input nodes I2 and I3 provided with complementary input signals "b" and "/b" (hereinafter, simply denoted as b and /b), and a pair of intermediate nodes M1 and M2 outputting complementary intermediate signals "m" and "/m" (hereinafter, simply denoted as m and /m). A signal transmission path comprised of a plurality of NMOSs is arranged between the input nodes and the intermediate nodes and is connected as a logic network for performing a desired logic operation. In the case of the AND, for example, NMOSs 1 and 2 are connected between the input nodes I1 and I2 and the intermediate node M1, respectively, and gates of the NMOS 1 and 2 are provided with complementary input signals b and /b, respectively. Further, NMOSs 3 and 4 are connected between input nodes I3 and I4 and the intermediate node M2, respectively, and gates of the NMOS 3 and 4 are also provided with the complementary input signals /b and b, respectively.

The intermediate nodes M1 and M2 are connected to CMOS inverters 5 and 6, respectively, which invert the intermediate signals m and /m, so that complementary output signals /a·b and a·b having desired logic levels are output from output nodes O1 and O2.

Hereinafter, a description will be given of an operation of the logic gate.

For example, when the input signals a and b have levels "H" and "L", respectively, the NMOSs 1 and 4 are in an OFF state, and the NMOSs 2 and 3 are in an ON state. In this case, the intermediate node M1 is connected to level "L" (that is, a ground potential) through the NMOS 2 and the intermediate node M2 is connected to level "H" (that is, a supply potential) through the NMOS 3. Accordingly, the intermediate signals m and /m are at levels "L" and "H", respectively. The intermediate signals m and /m are further inverted by the CMOS inverters 5 and 6, so that output signals having desired logic levels "H" and "L" based on the supply potential are output from the output nodes O1 and O2.

Here, it is assumed that the input signal b is changed from "L" to "H".

According to the change of the input signal b, the NMOSs 1 and 4 are changed from the OFF state to the ON state, and the NMOSs 2 and 3 are changed from the OFF state to the ON state. By this, the intermediate node M1 is connected to the input node I1 at level "H" through the NMOS 1, so that charge for the intermediate node M1 is started. On the other hand, the intermediate node M2 is connected to the input node I4 at level "L" through the NMOS, so that discharge for the intermediate M2 is started. The charge and discharge operations for the intermediate nodes M1 and M2 are started at a timing when the input signal b rises to about threshold voltage of the NMOSs 1 and 4 (for example, 0.2V). Further, when one of the intermediate nodes M1 and M2 is discharged, the other is charged.

As such, since the level changes of the intermediate nodes start when the input signal is at about the threshold voltage of the NMOS in the CPL, the operation speed can be enhanced compared with the conventional COMS logic circuit whose logic threshold voltage is ½ of the supply voltage.

Although one NMOS is connected between the input node and the intermediate node in the above-described CPL, when a 3-input type AND or complicated logic is configured as the CPL, two or more NMOSs should be serially connected between the input node and the intermediate node of the logic network. Therefore, there occurs a problem in that on-resistance between the input node and the intermediate node is increased, and accordingly the charge and discharge operations are delayed. Further, there is a problem in that when the inverters, which convert the intermediate signals m and /m of the intermediate nodes into desired levels to generate output signals, do not operate at a high-speed, it is not possible to operate the entire circuit at a high-speed.

SUMMARY OF THE INVENTION

It is, therefore, an objective of the present invention to provide a CPL of which operation speed is greatly improved.

According to an aspect of the present invention, there is provided a complementary pass-transistor logic which includes input nodes to which one or more pairs of first complementary signals are provided; a pair of intermediate nodes for outputting first and second complementary intermediate signals; a logic network which is connected between the input nodes and the intermediate nodes and comprised of N-channel MOS transistors whose conduction states are controlled by one or more pairs of second complementary input signals, the logic network outputting a logical operation result of the first input signals and second input signals to the intermediate nodes as the intermediate signals; and first and second inverters for inverting the intermediate signals to produce complementary output signals, wherein the N-channel MOS transistors of the logic network are configured as depletion type N-channel MOS transistors.

According to another aspect of the present invention, there is provided a semiconductor device, which includes first and second input nodes; a first output node; a first depletion-type transistor which is connected between the first input node and the first output node, the conduction state of the first depletion-type transistor being controlled by a first control signal; and a second depletion-type transistor which is connected between the second input node and the first output node, the conduction state of the second depletion-type transistor being controlled by a second control signal.

According to further another aspect of the present invention, there is provided a complementary pass-transistor logic, which includes a first input node which receives a first logic signal; a second input node which receives a second logic signal; a first output node; a first depletion-type NMOS transistor which is connected between the first input node and the first output node, the conduction state of the first depletion-type transistor being controlled by the second logic signal; a second depletion-type NMOS transistor which is connected between the second input node and the first output node, the conduction state of the second depletion-type transistor being controlled by a complementary logic signal of the second logic signal; a third input node which receives the complementary logic signal of the second logic signal; a fourth input node which receives a complementary signal of the first logic signal; a second output node; a third depletion-type NMOS transistor which is connected between the third input node and the second output node, the conduction state of the third depletion-type transistor being controlled by the complementary logic signal of the second logic signal; a fourth depletion-type NMOS transistor which is connected between the fourth input node and the second output node, the conduction state of the second depletion-type transistor being controlled by the second logic signal; and first and second inverter circuits for inverting intermediate signals output from the first and second nodes, respectively, to generate complementary signals.

According to the present invention, a logic network in a CPL is configured by DMOSs. With this configuration, threshold voltage of a transistor is reduced, and so the transistor is not in a complete OFF state when an input signal provided to the gate is at level "L", so that small amount of current can flow therethrough. Therefore, there is an advantage that when the input signal is changed, charge and discharge operations immediately start and a response speed is improved compared with a logic network configured with conventional (enhancement type) NMOSs, so that a high-speed operation can be obtained.

The logic network is configured with DMOSs and at the same time, a first inverter is comprised of a first NMOS, whose conduction state is controlled by a first intermediate signal, connected between a ground potential and a first output node and a first DMOS transistor, whose conduction state is controlled by a second intermediate signal, connected between the first output node and the supply potential, and a second inverter is comprised of a second NMOS, whose conduction state is controlled by the second intermediate signal, connected between the ground potential and a second output node and a second DMOS connected between the second output node and the supply potential and whose conduction state is controlled by the first intermediate signal.

Further, the complementary pass transistor logic has an acceleration circuit including a third NMOS transistors having a source being connected to the ground potential, a gate being connected to one end of the intermediate node, and a drain being connected to the other end of the intermediate node; a third DMOS having a drain being connected to the supply potential, and a source and a gate being connected to the drain of the third NMOS; a fourth NMOS having a source being connected to the ground potential, a gate being connected to the other end of the intermediate node, and a drain being connected to the one end of the intermediate node; and a fourth DMOS transistors having a drain being connected to the supply potential, and a source and a gate being connected to the drain of the fourth NMOS.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

First Embodiment

Figure 1:
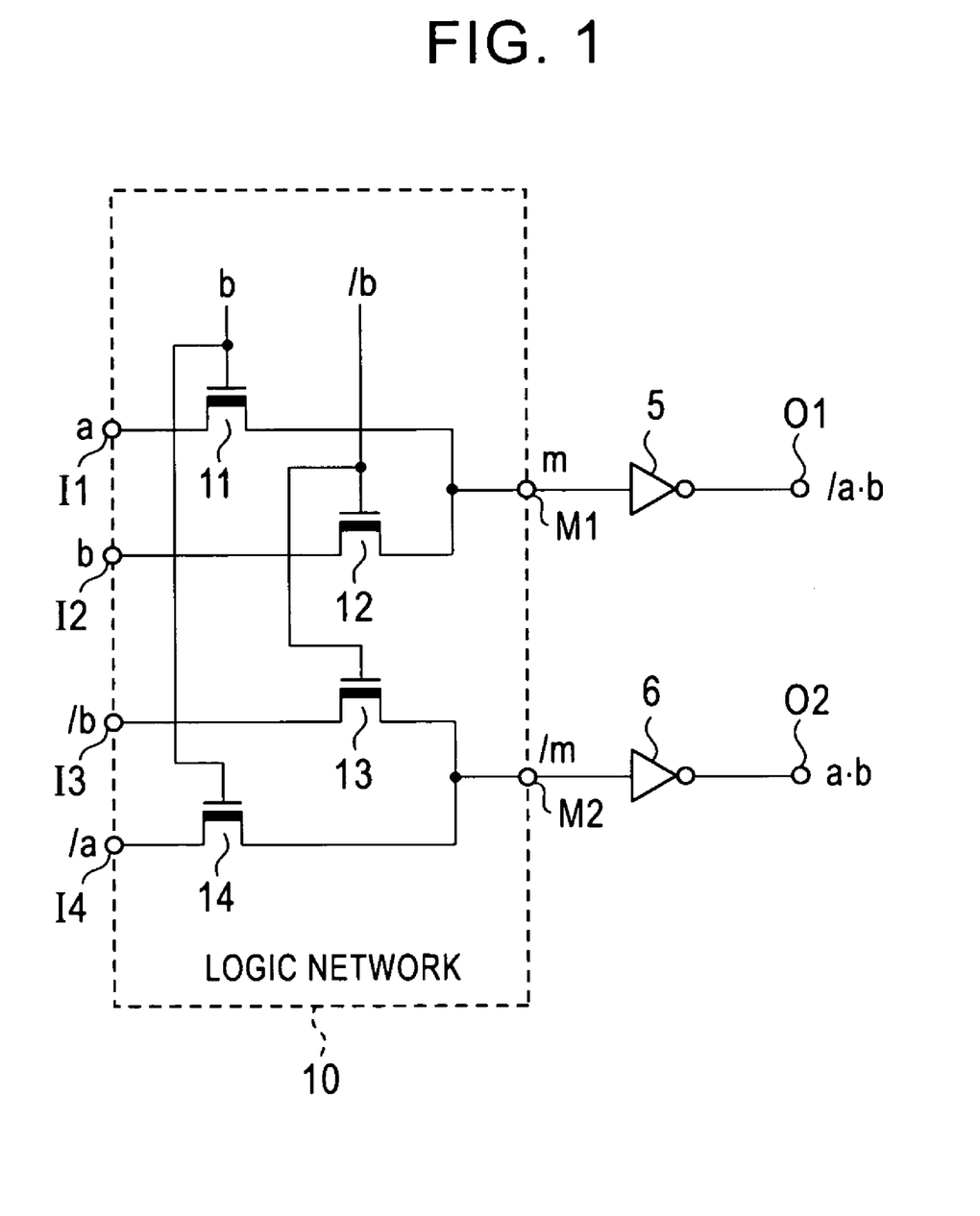
FIG. 1 shows a configuration of an AND comprised of a CPL in accordance with a first embodiment of the present invention.

FIG. 1 shows a configuration of an AND comprised of a CPL in accordance with a first embodiment of the present invention, in which the same elements as those of FIG. 2 are indicated by the same references.

The AND comprised of the CPL has a logic network 10 wherein the NMOSs configuring the logic network shown in FIG. 2 is replaced by DMOSs. The DMOS is formed by injecting ions into a gate region of the NMOS, which has a characteristics that drain current flows even though the threshold voltage becomes negative (for example, −0.2V) and zero biased. Meanwhile, since an enhancement type NMOS having no injected ions has a positive threshold voltage, the NMOS fully enters the OFF state in a zero bias so that drain current does not flow.

The logic network 10 has input nodes I1 and I4 to which complementary input signals a and /a are applied, input nodes I2 and I3 to which complementary input signals b and /b are applied, and a pair of intermediate nodes M1 and M2 which output complementary intermediate signals m and /m. There are arranged signal transmission passes comprised of a plurality of DMOSs, which is connected as a logic network for performing a desired logic operation, between the input nodes and the intermediate nodes.

In the case of the AND, for example, DMOSs 11 and 12 are connected between the input nodes I1 and I2 and the intermediate node M1, respectively, and gates of the DMOSs 11 and 12 are provided with complementary input signals b and /b of the input nodes I2 and I3, respectively, although their wiring is not shown in the figure. Further, DMOSs 13 and 14 are connected between input nodes I3 and I4 and the intermediate node M2, respectively, and the complementary input signals /b and b are applied to the gates of the DMOS 13 and 14, respectively.

The intermediate nodes M1 and M2 are connected to CMOS inverters 5 and 6, respectively, which invert the intermediate signals m and /m, so that complementary output signals /a·b and a·b having desired logic levels according to the supply potential are output from output nodes O1 and O2.

Hereinafter, a description will be given of an operation of the logic gate.

For example, when the input signals a and b are at levels "H" and "L", respectively, the input signals /a and /b are at levels "L" and "H", respectively. Accordingly, the DMOSs 12 and 13 controlled by the input signal /b at level "H" are in the ON state. Meanwhile, the DMOSs 11 and 14 controlled by the input signal b at level "L" are not completely in the OFF state but are maintained in a state where drain current can flow therethrough.

Since the input node I2 is at level "L", the intermediate node M1 is discharged by the DMOS 12 which is in the ON state, and then becomes at level "L". Further, since the input node I3 is at level "H", the intermediate node M2 is charged by the DMOS 13 which is in the ON state, and then becomes at level "H". Further, since current flowing through the DMOSs 11 and 14 is small, it does not affect the logic levels of the intermediate nodes M1 and M2. Accordingly, the intermediate signals m and /m are at levels "L" and "H", respectively. The intermediate signals m and /m are further inverted by the COMS inverters 5 and 6, and complementary output signals /a·b and a·b having desired logic levels "H" and "L" according to the supply potential are output from the CMOS inverters 5 and 6.

Here, it is assumed that the input signal b is changed in level from "L" to level "H".

Since the input signal b at level "L" is already exceeds threshold voltages of the DMOSs 11 and 14, the input signal b rises from level "L" to level "H" and at the same time, the DMOSs 11 and 14 immediately start to change from an incomplete ON state to a complete ON state. Further, the DMOSs 12 and 13 are changed from the complete ON state to the incomplete OFF state.

When the conduction state of the DMOSs 11 and 14 and the DMOSs 12 and 13 is reversed as the level of the input signal b rises, the intermediate node M1 is connected to the input node I1 at level "H" through the DMOS 11, and then charging of the intermediate node M1 starts. Meanwhile, the intermediate node M2 is connected to the input node 14 at level "L" through the DMOS 14 and then discharge starts for the intermediate node M2.

When the level of the intermediate signal m exceeds the threshold of the CMOS inverter 5 as the intermediate node M1 is charged, the output signal /a·b at level "L" is output from the CMOS inverter 5. Further, when the level of the intermediate signal /m is reduced to the threshold voltage of the CMOS inverter 6 or less by discharging the intermediate node M2, the output signal a·b at level "H" is output from the CMOS inverter 6.

Figure 3:
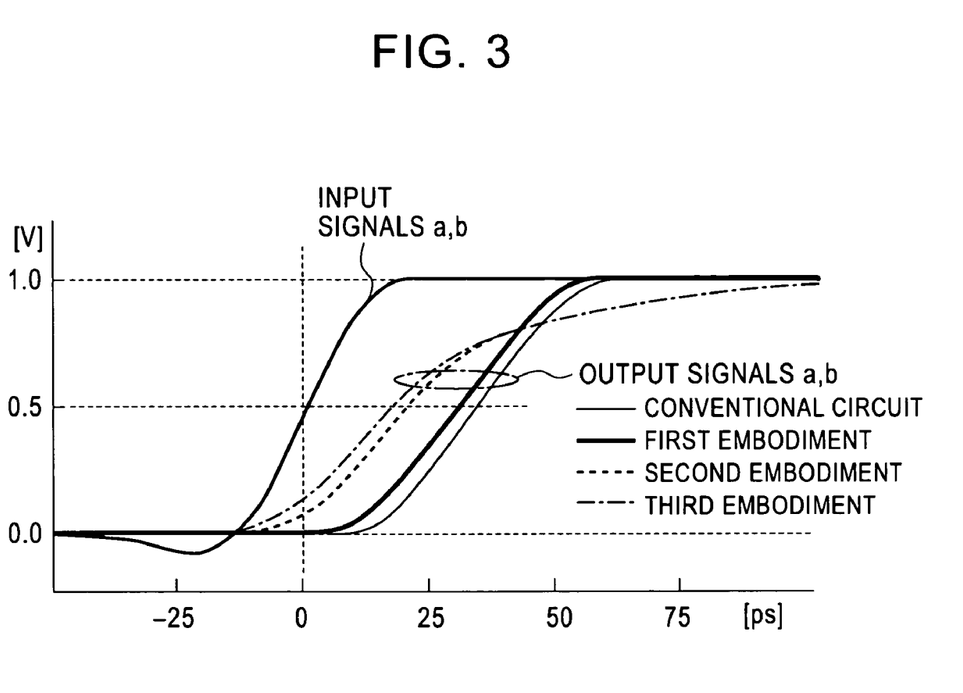
FIG. 3 is a simulation waveform illustrating an operation of the AND of FIG. 1.

FIG. 3 is a simulation waveform illustrating an operation of the AND FIG. 1, wherein the axes of abscissa and ordinate indicate time and potential, respectively.

FIG. 3 shows a waveform of the output node O1 when the input signals a and b are simultaneously risen from level "L" to level "H". Referring to FIG. 3, a thin solid line is an output signal a·b in the conventional circuit of FIG. 2, and a thick solid line is an output signal a·b in the circuit of the first embodiment. In this simulation, the supply voltage was set to 1V, the threshold voltage of the DMOS was set to −0.2V, and the threshold voltage of the NMOS was set to 0.02V (In an enhancement type NMOS, this is the minimum possible threshold voltage). Further, FIG. 3 shows output signals a·b in circuits of second and third embodiments to be described below as a dotted line and a dash dotted line.

As shown in FIG. 3, a delay time from when the input signal a·b rises from level "L" to level "H" (that is, rises to 0.5V) to when the output signal a·b rises from level "L" to level "H", is 33 ps in the conventional circuit and 28 ps in the circuit of the first embodiment. Accordingly, the CPL of the first embodiment can reduce the delay time by 15% as compared with the conventional CPL.

As such, since the logic network 10 forming the charge and discharge pass is configured as the DMOS in the CPL of the first embodiment, there is an advantage that the CPL has a higher response speed compared with the conventional NMOS so that the operation speed can be greatly enhanced.

Further, the present invention is not limited to the first embodiment and can be variously modified. Examples of such modifications include the following example.

(1) Although the logic network 10 is configured as a 2-input AND, it is not limited to the AND but can be replaced with an arbitrary logic circuit such as an OR gate, an EOR gate, and so on.

(2) Although the threshold voltage of the DMOS is set as −0.2V, the threshold voltage is not limited to the voltage. However, if the absolute value of the negative threshold voltage becomes high, through current is increased and thus consumption power increases. Further, if the absolute value of the threshold voltage exceeds ½ of the supply voltage, although the gate voltage is 0V, a voltage exceeding the logical threshold voltage is applied to the source electrode. On the other hand, if the absolute value of the negative threshold voltage becomes low, the difference between the threshold value of the DMOS and that of the NMOS becomes reduced and then improvement of the response speed becomes reduced. Accordingly, a target of the threshold voltage of the DMOS in the absolute value becomes 20 to 40% of the supply voltage.

Second Embodiment

Figure 4:
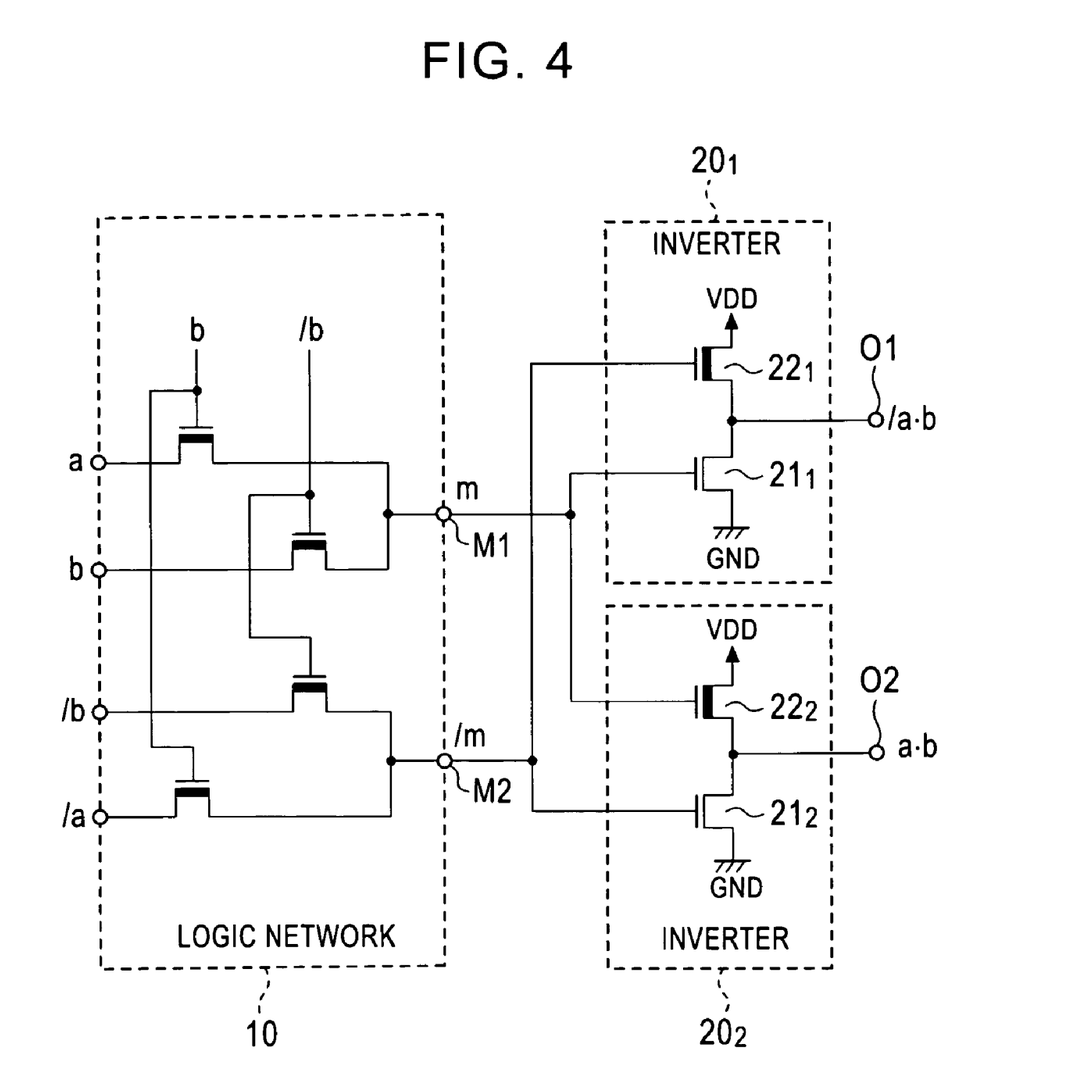
FIG. 4 shows a configuration of an AND comprised of a CPL in accordance with a second embodiment of the present invention.

FIG. 4 shows a configuration of an AND comprised of a CPL in accordance with a second embodiment of the present invention, in which the same elements as those of FIG. 1 are indicated by the same reference numerals.

The CPL has inverters $20_1$ and $20_2$ formed of a differential EDMOS logic instead of the CMOS inverters 5 and 6 in FIG. 1.

The differential EDMOS logic is configured by serially connecting enhancement type and depletion type NMOSs between ground potential GND and supply potential VDD and by differentially controlling ON/OFF of the NMOSs using complementary signal.

The inverter $20_1$ is configured by serially connecting an NMOS $21_1$ and a DMOS $22_1$, wherein a gate of the NMOS $21_1$ is connected to the intermediate node M1, and a gate of the DMOS $22_1$ is connected to the intermediate node M2. Further, the drain of the NMOS $21_1$ is connected to the output node O1 so as to output the output signal /a·b.

Meanwhile, the inverter $20_2$ is configured by serially connecting an NMOS $21_2$ and a DMOS $22_2$, wherein a gate of the NMOS $21_2$ is connected to the intermediate node M2 and a gate of the DMOS $22_2$ is connected to the intermediate node M1. Further, the drain of the NMOS $21_2$ is connected to the output node O2 so as to output the output signal a·b. The remaining configuration is similar to that in FIG. 1

A description of the operation is as follows.

The logic network 10 in the CPL is the same as that of the first embodiment and the operation of the logic network 10 is described above. For example, when input signals a and b are at levels "H" and "L", respectively, the intermediate signals m and /m of the intermediate nodes M1 and M2 are at levels "L" and "H", respectively.

Thus, the NMOS $21_2$ and DMOS $22_1$ of the inverter $20_1$ are in the OFF state and the ON state, respectively, and the output signal a·b is at level "H". Further, the NMOS $21_2$ of the inverter 20$_2$ is in the ON state, and the DMOS 22$_2$ thereof is in an incomplete ON state. Thus, while a small amount of current flows through the inverter 20$_2$, the output signal /a·b is at level "L".

Here, when the input signal b changes from level "L" to level "H", intermediate signals m and /m of the intermediate node M1 and M2 change to levels "H" and "L", respectively. Thus, the NMOS 21$_1$ and DMOS 22$_1$ of the inverter 20$_1$ are in the ON state and incomplete OFF state, respectively, and the output signal a·b is at level "L". Further, the NMOS 21$_2$ of the inverter 20$_2$ is in the OFF state, the DMOS 22$_2$ thereof changes from the incomplete OFF state to the ON state, and the output signal /a·b is at level "H". Since the DMOS 22$_2$ is not in the complete OFF state although the intermediate signal m is at level "L", the DMOS 22$_2$ immediately starts to change from the incomplete OFF state to the ON state as the intermediate signal m rises from level "L" to level "H.

The delay time occurred in the simulation of CPL in the second embodiment is 19 ps as indicated in a dotted line of FIG. 3, which represents a 40% reduction as compared with the conventional CPL.

As such, while the logic network 10 forming the charge and discharge pass is configured as the DMOS in the CPL of the second embodiment, the inverter 20 of the output node is configured as the differential EDMOS logic. With the configuration, there is an advantage that a response speed can be higher than in the conventional CMOS inverter, and so operation speed can be greatly improved.

Third Embodiment

Figure 5:
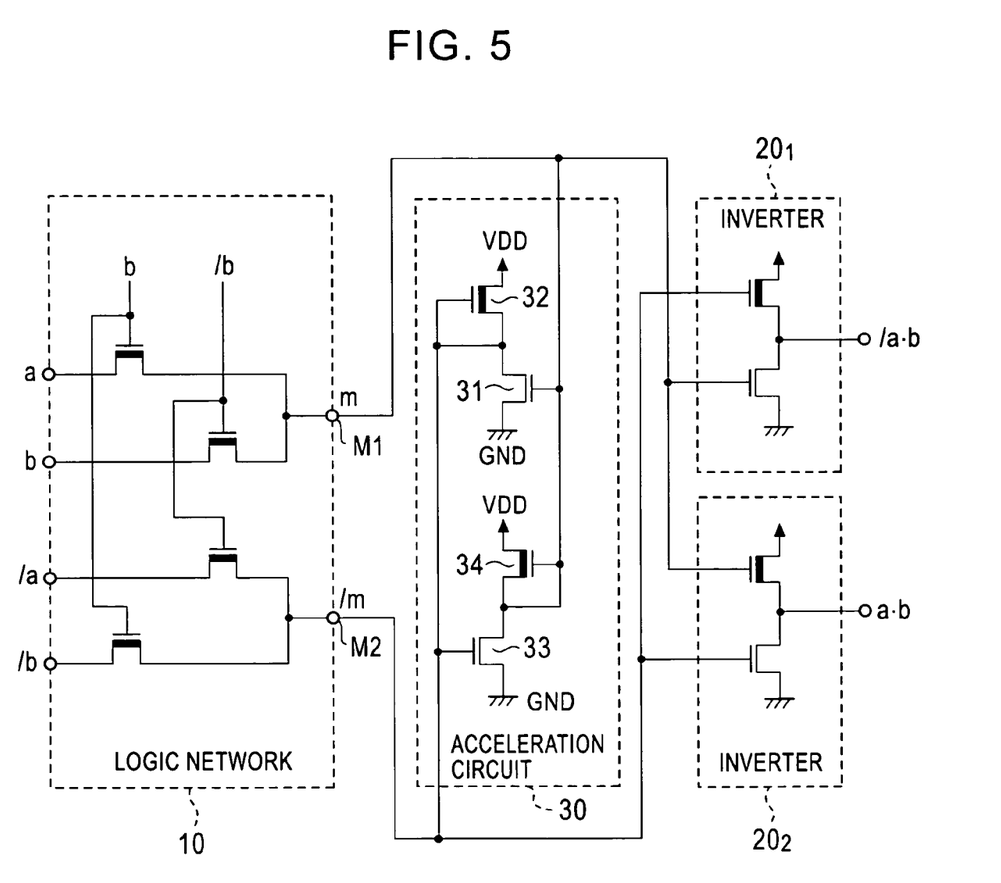
FIG. 5 shows a configuration of an AND comprised of a CPL in accordance with a third embodiment of the present invention.

FIG. 5 shows a configuration of an AND comprised of a CPL in accordance with a third embodiment of the present invention, in which the same elements as those of FIG. 4 are indicated as the same reference numerals.

The CPL has an acceleration circuit 30 comprised of a differential EDMOS logic, which is connected between the intermediate nodes M1 and M2 of FIG. 4.

The acceleration circuit 30 is comprised of a first inverter which inverts a signal of the intermediate node M1 and outputs the inverted signal to the intermediate node M2 and a second inverter which inverts a signal of the intermediate node M2 and outputs the inverted signal to the intermediate node M1. The inverters are configured by serially connecting enhancement and depletion NMOSs between the ground potential GND and the supply potential VDD so as to perform differential ON/OFF-control of the NMOSs by complementary signals, in the same manner as the inverter 20 of FIG. 4.

Specifically, the acceleration circuit 30 is comprised of a first inverter including an NMOS 31 having a source being connected to the ground potential GND, a gate being connected to the intermediate node M1 and a drain being connected to the supply potential VDD, and a DMOS 32 having a drain being connected to the supply potential VDD and a source and a gate being connected to the drain of the NMOS 31: and a second inverter including an NMOS 33 having a source being connected to the ground potential GND, a gate being connected to the intermediate node M2 and a drain being connected to the intermediate node M1, and a DMOS 34 having a drain being connected to the supply potential VDD and a source and a gate being connected to the drain of the NMOS 33.

A description of the operation of the acceleration circuit 30 is as follows.

For example, when the intermediate signals m and /m are at levels "L" and "H", respectively, the NMOS 31 of the first inverter is in the OFF state and the DMOS 32 thereof is in the ON state. Meanwhile, although the NMOS 33 of the second inverter is in the ON state and the DMOS 34 thereof is in the OFF state, the DMOS 34 is not in a complete OFF state and thus current flows therethrough since the threshold voltage of the DMOS 34 is negative. Thus, the intermediate signal m of the intermediate node M1 that is output side of the second inverter slightly rises over the complete level "L".

Next, if the intermediate signals m and /m are inverted to levels "H" and "L", respectively, according to the change of the input signals a and b, the intermediate node M1 changes from a slightly high level "L" to level "H". Thus, the intermediate node M1 rapidly changes to level "H", and accordingly, the NMOS 31 of the first inverter enters the ON state and the intermediate node M2 rapidly changes to level "L".

While the intermediate node M2 becomes at level "L", the intermediate signal /m slightly rises over the complete level "L" since the DMOS 32 of the first inverter that is given the intermediate signal /m of the intermediate node M2 is not in the complete OFF state. Thus, an operation performed when next intermediate signals m and /m are inverted is accelerated.

As such, by connecting the acceleration circuit 30 between the intermediate nodes M1 and M2 from which complementary intermediate signals m and /m are output, a level change of the intermediate nodes M1 and M2 is accelerated so that an operation speed of the CPL is enhanced.

Although the delay time by the simulation of CPL in accordance with the third embodiment is 16 ps as shown in a dash dotted line of FIG. 3, the delay time can be shortened by about 50% compared with the conventional CPL.

As such, in the CPL of the third embodiment, the logic network 10 forming the charge and discharge pass is configured with the DMOS, the inverter 20 of the output stage is configured by the differential EDMOS logic, and the acceleration circuit 30 comprised of the differential EDMOS logic is connected between the intermediate nodes M1 and M2. Therefore, there is an advantage that the operation speed can be greatly improved.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2004-340174 which is hereby incorporated by reference.

What is claimed is:

1. A complementary pass-transistor logic comprising:
    input nodes to which one or more pairs of first complementary input signals are provided;
    a pair of intermediate nodes for outputting first and second complementary intermediate signals;
    a logic network which is connected between the input nodes and the intermediate nodes and comprised of N-channel MOS transistors whose conduction states are controlled by one or more pairs of second complementary input signals, the logic network outputting a logical operation result of the first complementary input signals and the second complementary input signals to the intermediate nodes as the intermediate signals; and
    first and second inverters for inverting the intermediate signals to produce complementary output signals,
    wherein the N-channel MOS transistors of the logic network are configured as depletion type N-channel MOS transistors, wherein the first inverter is comprised of a first enhancement-type N-channel MOS transistor which is connected between a ground potential and a first output node and whose conduction state is controlled by the first intermediate signal and a first depletion-type N-channel MOS transistor which is connected between the first output node and a supply potential and whose conduction state is controlled by the second intermediate signal, and wherein the second inverter is comprised of a second enhancement-type N-channel MOS transistor which is connected between the ground potential and a second output node and whose conduction state is controlled by the second intermediate signal, and a second depletion-type N-channel MOS transistor which is connected between the second output node and the supply potential and whose conduction state is controlled by the first intermediate signal.

2. The complementary pass-transistor logic according to claim 1, further includes an acceleration circuit, the acceleration circuit comprising:

a third enhancement-type N-channel MOS transistor having a source connected to the ground potential, a gate connected to one of the pair of intermediate nodes and a drain connected to the other of the pair of intermediate nodes;

a third depletion-type N-channel MOS transistor having a drain connected to the supply potential, a source and a gate connected to the drains of the third enhancement-type N-channel MOS transistor;

a fourth enhancement-type N-channel MOS transistor having a source connected to the ground potential, a gate connected to the other of the pair of intermediate nodes and a drain connected to the one of pair of the intermediate nodes; and a fourth depletion-type N-channel MOS transistors having a drain connected to the supply potential, and a source and a gate connected to the drains of the fourth enhancement-type N-channel MOS transistor.

3. A complementary pass-transistor logic comprising:
a first input node which receives a first logic signal;
a second input node which receives a second logic signal;
a first output node;
a first depletion-type NMOS transistor which is connected between the first input node and the first output node, the conduction state of the first depletion-type NMOS transistor being controlled by the second logic signal;
a second depletion-type NMOS transistor which is connected between the second input node and the first output node, the conduction state of the second depletion-type NMOS transistor being controlled by a complementary logic signal of the second logic signal;
a third input node which receives a complementary logic signal of the second logic signal;
a fourth input node which receives a complementary logic signal of the first logic signal;
a second output node;
a third depletion-type NMOS transistor which is connected between the third input node and the second output node, the conduction state of the third depletion-type NMOS transistor being controlled by the complementary logic signal of the second logic signal;
a fourth depletion-type NMOS transistor which is connected between the fourth input node and the second output node, the conduction state of the forth depletion-type NMOS transistor being controlled by the second logic signal; and
first and second inverter circuits for inverting intermediate signals output from the first and second nodes, respectively, to generate complementary signals,
wherein each of the first and second inverter circuits is configured as a differential EDMOS logic having an enhancement-type NMOS and depletion-type NMOS serially connected between ground potential and supply potential, the conduction states of the enhancement-type and depletion-type NMOSs being differentially controlled by complementary signals.

* * * * *

UNITED STATES PATENT AND TRADEMARK OFFICE
CERTIFICATE OF CORRECTION

PATENT NO. : 7,394,294 B2 Page 1 of 1
APPLICATION NO. : 11/283852
DATED : July 1, 2008
INVENTOR(S) : Akira Akahori It is certified that error appears in the above-identified patent and that said Letters Patent is hereby corrected as shown below:

Col. 10, in line 26 of claim 3 "forth" should be --fourth--.

Signed and Sealed this

Twenty-third Day of September, 2008

JON W. DUDAS
*Director of the United States Patent and Trademark Office*